United States Patent
Colinge et al.

(10) Patent No.: US 9,209,247 B2
(45) Date of Patent: Dec. 8, 2015

(54) SELF-ALIGNED WRAPPED-AROUND STRUCTURE

(71) Applicant: Taiwan Semiconductor Manufacturing Company, Ltd., Hsin-Chu (TW)

(72) Inventors: Jean-Pierre Colinge, Hsin-Chu (TW); Kuo-Cheng Ching, Zhubei (TW); Ta-Pen Guo, Cupertino, CA (US); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 13/782,528

(22) Filed: May 10, 2013

(65) Prior Publication Data

US 2014/0332859 A1    Nov. 13, 2014

(51) Int. Cl.
  H01L 21/8238    (2006.01)
  H01L 29/06     (2006.01)
  H01L 29/423    (2006.01)
  H01L 29/66     (2006.01)
  H01L 29/775    (2006.01)

(52) U.S. Cl.
  CPC ........ *H01L 29/0676* (2013.01); *H01L 29/4238* (2013.01); *H01L 29/42376* (2013.01); *H01L 29/66439* (2013.01); *H01L 29/775* (2013.01); *H01L 29/66469* (2013.01)

(58) Field of Classification Search
  USPC ............... 257/302, 329; 438/206, 156, 299
  See application file for complete search history.

(56) References Cited

U.S. PATENT DOCUMENTS

| 7,759,729 | B2 |  | 7/2010 | Bjoerk et al. |
| 8,076,231 | B2 |  | 12/2011 | Saitoh et al. |
| 8,164,146 | B2 |  | 4/2012 | Lung |
| 8,772,771 | B2 | * | 7/2014 | Tanaka ............................ 257/43 |
| 2009/0242990 | A1 |  | 10/2009 | Saitoh et al. |
| 2011/0303985 | A1 | * | 12/2011 | Masuoka et al. .............. 257/369 |

(Continued)

FOREIGN PATENT DOCUMENTS

| JP | 2009239167 | 10/2009 |
| KR | 20060012724 | 2/2006 |

OTHER PUBLICATIONS

Cho, H.-J. et al., "Investigation of Gate Etch Damage at Metal/High-k Gate Dielectric Stack Through Random Telegraph Noise in Gate Edge Direct Tunneling Current," IEEE Electron Device Letters, vol. 32, No. 4, Apr. 2011, pp. 569-571.

(Continued)

*Primary Examiner* — Errol Fernandes
(74) *Attorney, Agent, or Firm* — Slater & Matsil, L.L.P.

(57) ABSTRACT

An embodiment vertical wrapped-around structure and method of making. An embodiment method of making a self-aligned vertical structure-all-around device including forming a spacer around an exposed portion of a semiconductor column projecting from a structure layer, forming a photoresist over a protected portion of the structure layer and a first portion of the spacer, etching away an unprotected portion of the structure layer disposed outside a periphery collectively defined by the spacer and the photoresist to form a structure having a footer portion and a non-footer portion, the non-footer portion and the footer portion collectively encircling the semiconductor column, and removing the photoresist and the spacer.

20 Claims, 18 Drawing Sheets

(56) References Cited

U.S. PATENT DOCUMENTS

2012/0223288 A1 9/2012 Kim et al.
2014/0225184 A1 8/2014 Colinge et al.

OTHER PUBLICATIONS

Chu, M., et al., "Strain: A Solution for Higher Carrier Mobility in Nanoscale MOSFETs," Annual Reviews, vol. 39, May 27, 2009, pp. 1-12.

Ferain, I. et al., "Multigate transistors as the future of classicla metal-oxide-semiconductor field-effect transistors," Nature, vol. 479, Nov. 17, 2011, pp. 2-8.

Flachowsky, S., et al., "Understanding Strain-Induced Drive-Current Enhancement in Strained-Silicon n-MOSFET and p-MOSFET," IEEE Transactions on Electron Devices, vol. 57, No. 6, Jun. 2010, pp. 1343-1354.

Gandhi, R. et al., "Vertical Si-Nanowire n-Type Tunneling FETs With Low Subthreshold Swing (<50 mV/decade) at Room Temperature," IEEE Electron Device Letters, vol. 32, No. 4, Apr. 2011, pp. 437-439.

Hashemi, P., et al., "Gate-All-Around n-MOSFETs Wtih Uniaxial Tensile Strain-Induced Performance Enhancement Scalable to Sub-10-nm Nanowire Diameter," IEEE Electron Device Letters, vol. 30, Issue 4, Apr. 2009, pp. 401-403.

Ionescu, A.M. et al., "Tunnel field-effect transistors as energy-efficient electronic switches," Review, doi: 10.1038/nature10679, Nature, vol. 479 Nov. 17, 2011, pp. 329-337.

Kim, K., "Future Silicon Technology," 2012 Proceedings of the European Solid State Device Research Conference, pp. 1-6.

Kwong, D.-L. et al., "Vertical Silicon Nanowire Platform for Low Power Electronics and Clean Energy Applications," Hindawi Publishing Corporation, Jopurnal of Nanotechnology, vol. 2012, Article ID 492121, pp. 1-21.

Larrieu, G. et al., "Vertical nanowire array-based field effect transistors for ultimate scaling," The Royal Society of Chemistry, Jan. 2013, pp. 2437-2441.

Liang, J. et al., "Relaxation of compressed eleastic islands on a viscous layer," Pergamon, www.actamat-journals.com, Acta Materialia 50 (2002) 2933-2944.

Maheshwaram, S., et al., "Device Circuit Co-Design Issues in Vertical Nanowire CMOS Platform," IEEE Electron Device Letters, vol. 33, Issue 7, Jul. 2012, pp. 934-936.

Niquet, Y.-M. et al., "Carrier Mobility in strained Ge nanowires," Journal of Applied Physics 112, 084301 (2012), pp. 084301-1-084301-4.

Peterson, R.L. et al., "Comment on 'Fabrication of Strained Silicon on Insulator by Strain Transfer Process' [Appl. Phys. Lett. 87, 051921 (2005)]," Appl. Phys. Lett 88, 146101 (2006), 3 pages.

Schmidt, V. et al., "Realization of a Silicon Nanowire Vertical Surround-Gate Field-Effect Transistor," Small, vol. 2, Issue 1, Jan. 2006, pp. 85-88.

Shen, N. et al., "Vertical GAA Silicon Nanowire Transistor with Impact of Temperature on Device Parameters," World Academy of Science, Engineering and Technology, Issue 48, Dec. 2010, pp. 976-979.

Sun, Y. et al., "Junctionless Vertical-Si-Nanowire-Channel-Based SONOS Memory With 2-Bit Storage per Cell," IEEE Electron Device Letters, vol. 32, Issue 6, Jun. 2011, pp. 725-727.

Thelander, C. et al., "Nanowire-based one-dimensional electronics," Materials Today, vol. 9, Issue 10, Oct. 2006, pp. 28-35.

Tomioka, K. et al., "A III-V nanowire channel on silicon for high-performance vertical transistors," Nature, vol. 488, Aug. 9, 2012, 14 pages.

Vandooren, A., et al., "Impact of process and geometrical parameters on the electrical characteristics of vertical nanwire silicon n-TFETs," Solid-State Electronics 72 (2012) pp. 82-87.

Wikipedia, "Strain engineering," http://en.wikipedia.org/wiki/Strain_engineering, downloaded Jul. 5, 2013, 2 pages.

Windbacher, T., "2.2.2 Local Strain," http://www.iue.tuwien.ac.at/phd/windbacher/node19.html, downloaded Jul. 5, 2013, 4 pages.

Yin, H., "Strain Relaxation of SiGe on Compliant BPSG and Its Applications," Dissertaion Presented to the Faculty of Princeton University in Candidacy for the Degree of Doctor of Philosophy, Nov. 2004, 6 pages.

Yin, H. et al., "Strain relaxation of SiGe islands on compliant oxide," Journal of Applied Physics, vol. 91, No. 12, Jun. 15, 2002, pp. 9716-9722.

Cea, S.M ,et al., "Process Modeling for Advanced Device Technologies," J. Comput. Electron, vol. 13, Issue 1, pp. 18-32, Aug. 6, 2013.

Pham-Nguyen, L., et al., "Mobility enhancement by CESL strain in short-channel ultrathin SOI MOSFETs," Solid-State Electronics 54, www.elesevier.com/locate/sse, pp. 123-130, Dec. 2009.

Zhu, Yong, et al., "Mechanical Properties of Vapor-Liquid-Solid Synthesized Silicon Nanowires," Nano Letters, vol. 9, No. 11, pp. 3934-3939, Jul. 2009.

* cited by examiner

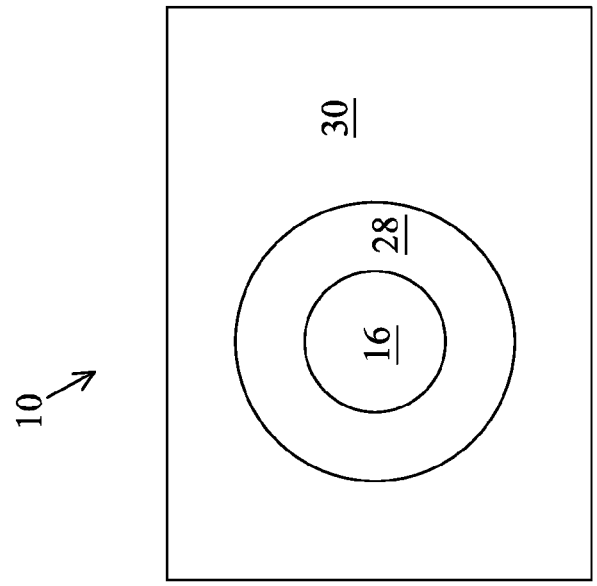
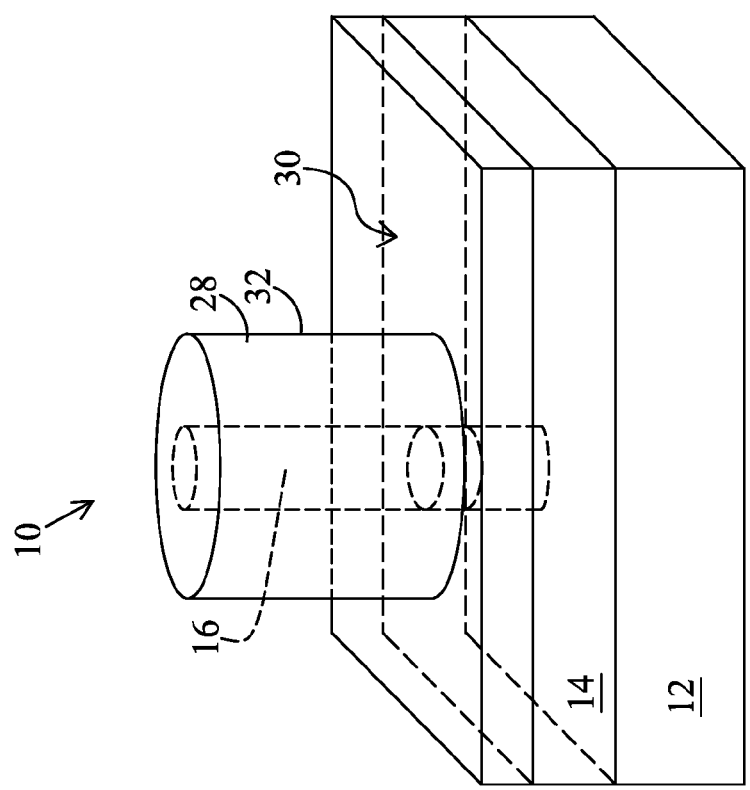
Fig. 2B
Fig. 2A

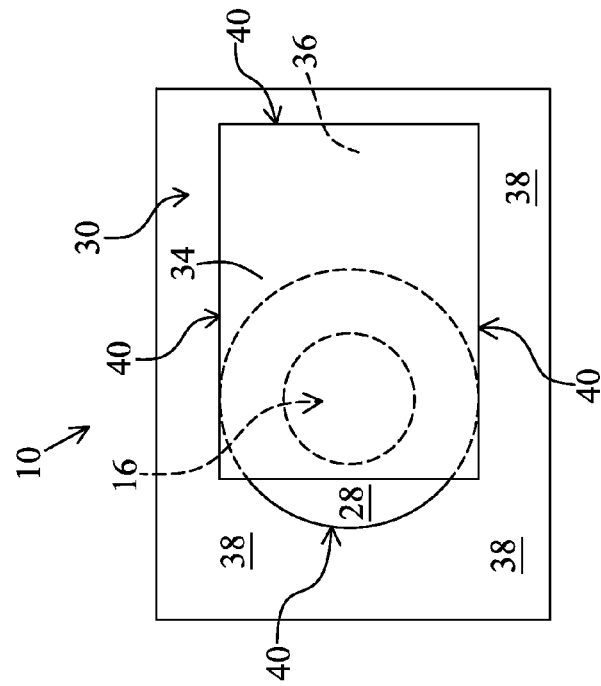
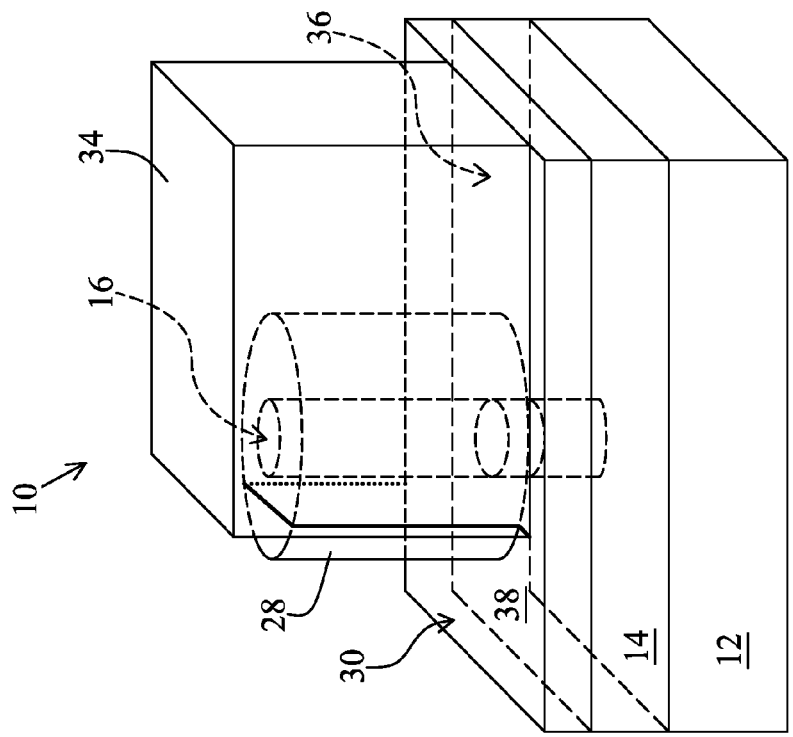
Fig. 3A
Fig. 3B

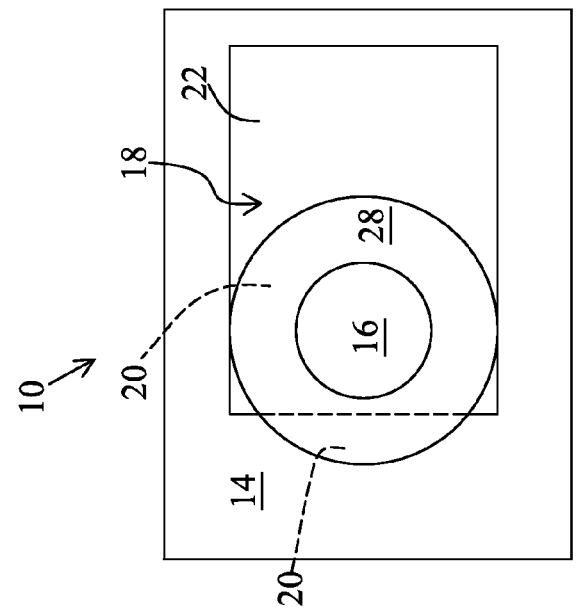
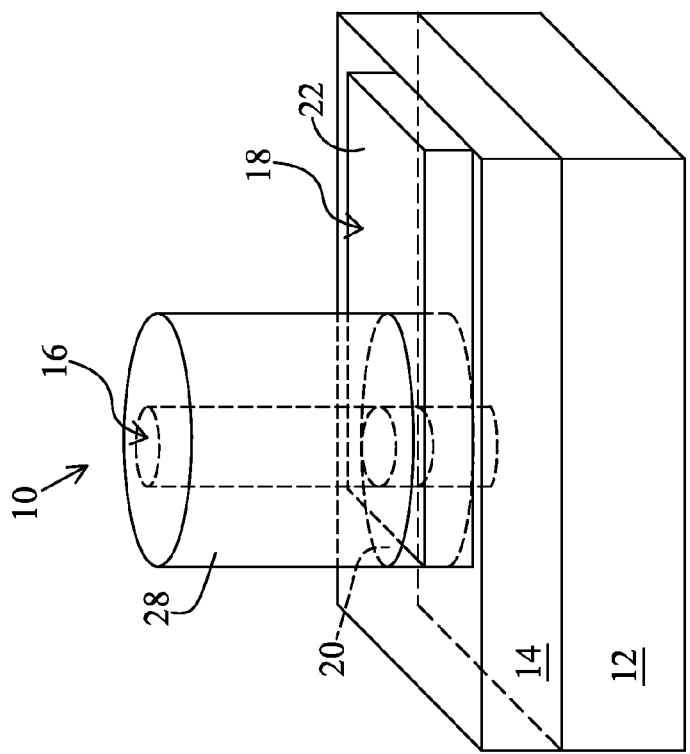
Fig. 4B
Fig. 4A

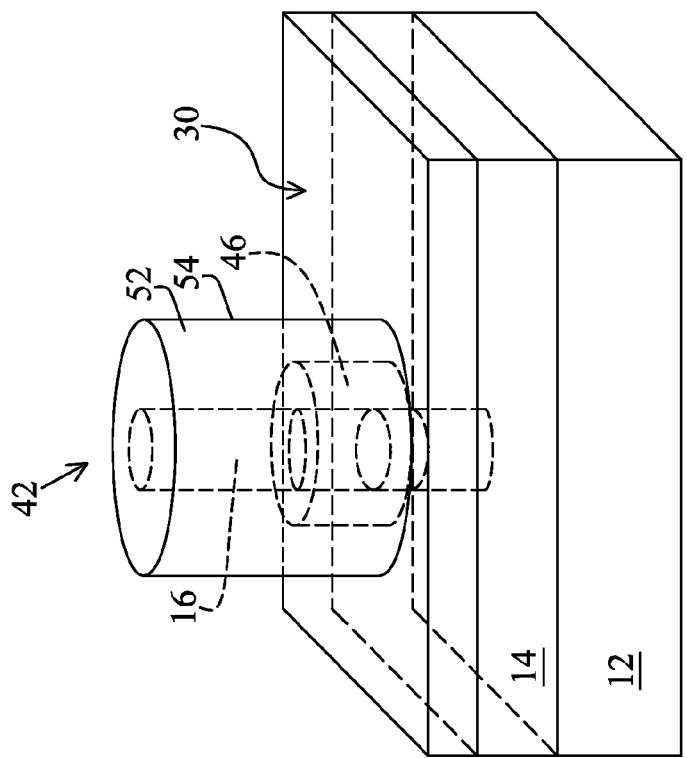
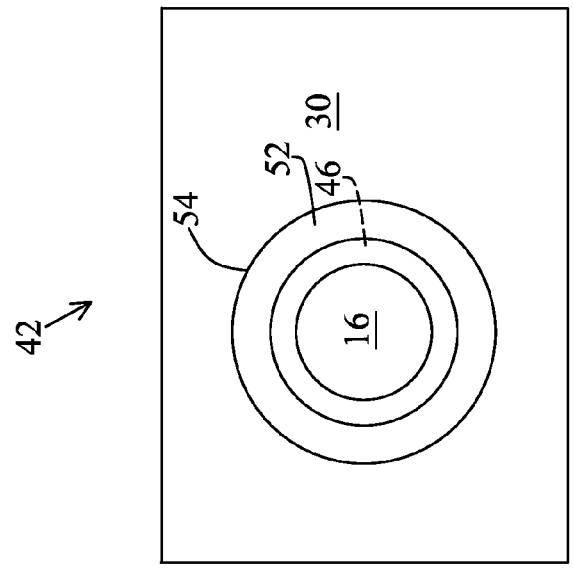
Fig. 9A
Fig. 9B

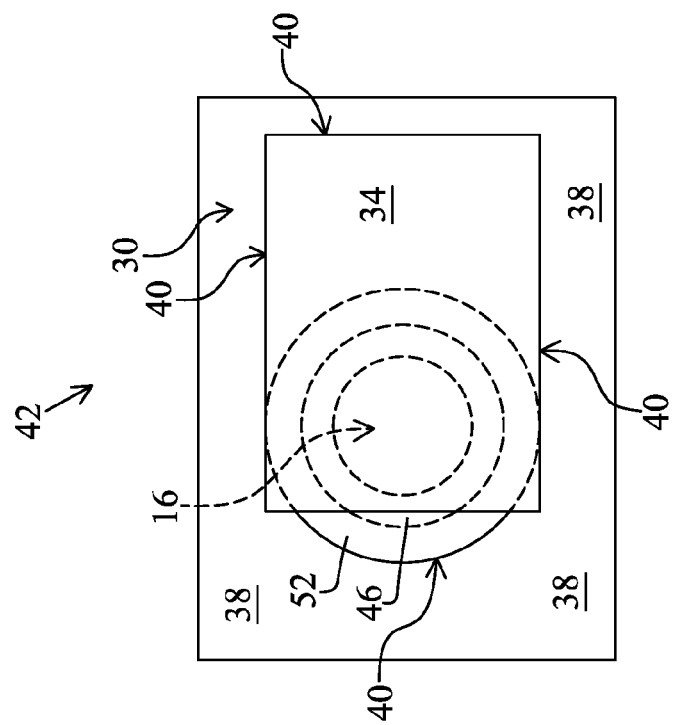
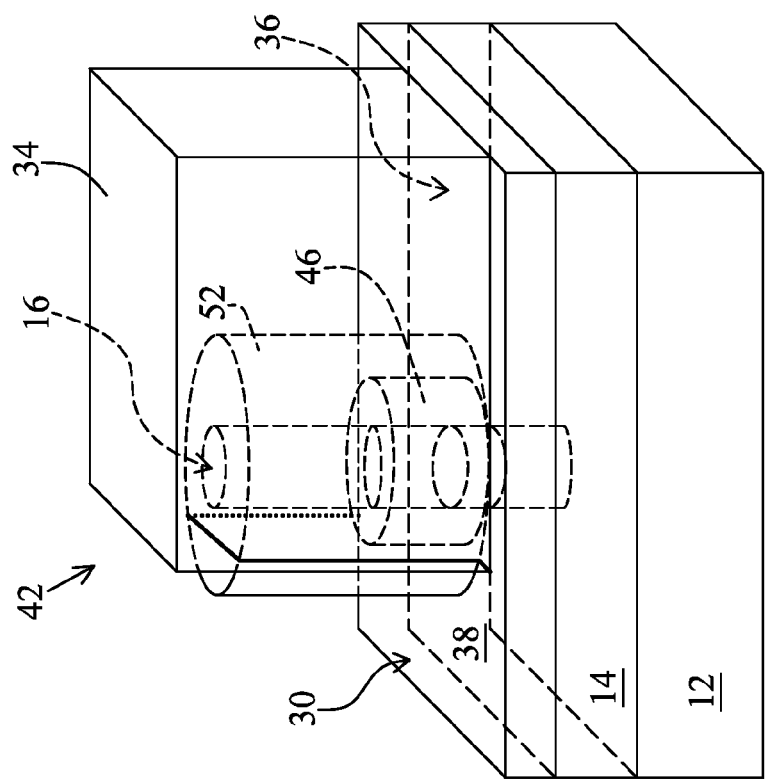

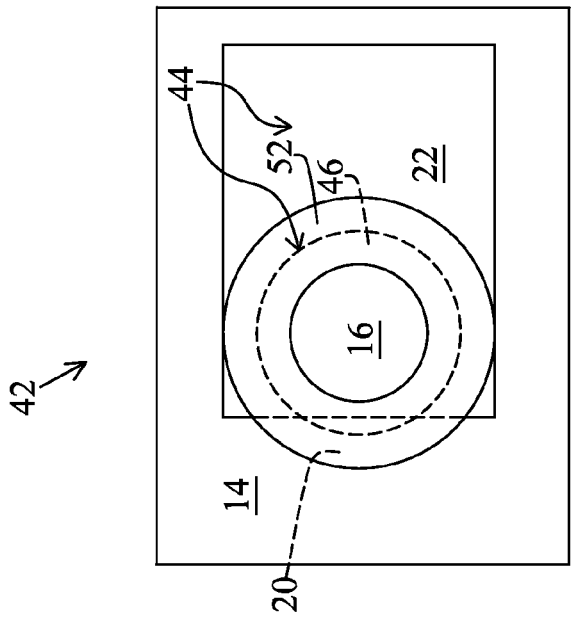
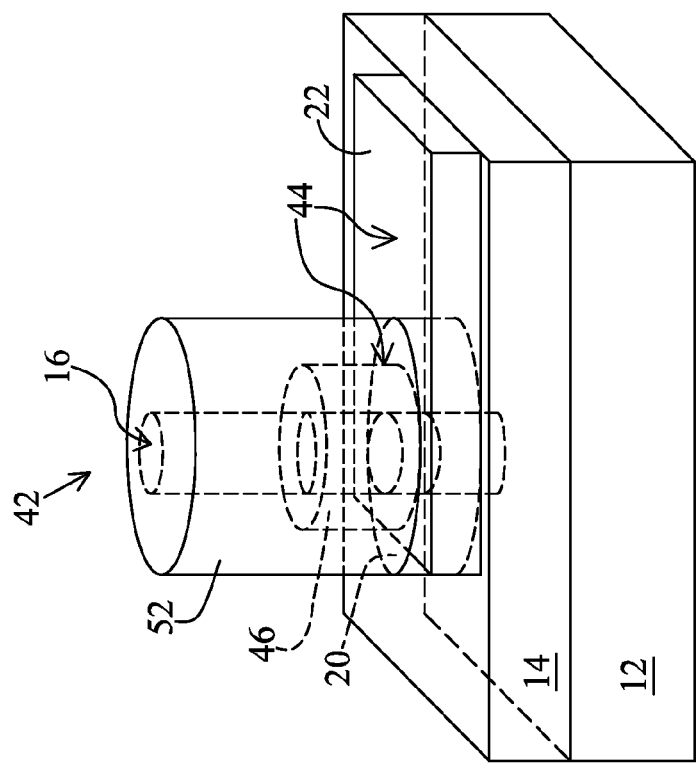
Fig. 11B
Fig. 11A

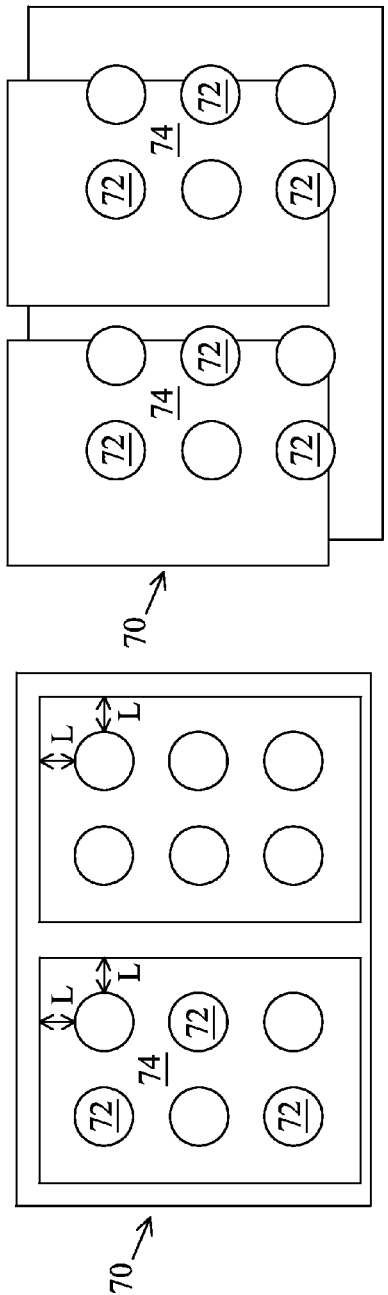
Fig. 17
Fig. 18
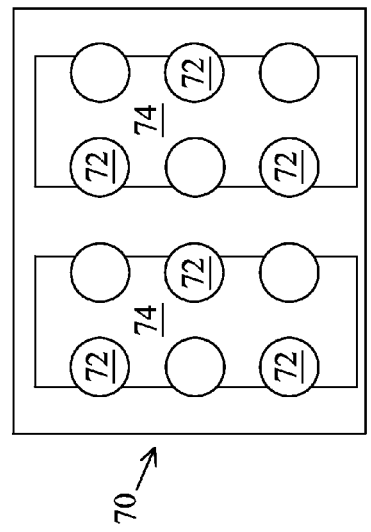
Fig. 19

SELF-ALIGNED WRAPPED-AROUND STRUCTURE

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, gate-all-around FETs were developed. The gate-all-around FETs are similar in concept to FETs except that the gate material surrounds the channel region on all sides.

In a vertical gate-all-around (VGAA) transistor, the gate must be wrapped around the entire circumference or perimeter of a vertical semiconductor column (e.g., a nanowire). Because the gate electrode is produced by depositing a metal (and a thin gate dielectric) and etching the excess metal using lithography, the gate pattern must fully surround the nanowire. This imposes constraints on gate lithography, in particular to the alignment of the gate mask level to the nanowire level. The constraints limit the integration density and constitute a potential yield hazard.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 2A-2B to FIGS. 5A-5B illustrate a cross section and a top view of a process of forming the embodiment vertical gate-all-around transistor of FIG. 1;

FIGS. 17-19 illustrate a tolerance needed for a conventional vertical gate-all-around transistor and a conventional vertical gate-all-around transistor that is defective due to misalignment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a vertical gate-all-around (VGAA) transistor. Even so, the inventive concepts disclosed herein are not limited to the formation of a self-aligning gate. Indeed, other self-aligning structures other than a gate may also be formed using the inventive concepts disclosed herein. In addition, even though the disclosure is directed toward embodiment VGAA transistors, the inventive concepts disclosed herein may be applied to other types of integrated circuits, electronic structures, and the like.

Figure 1:
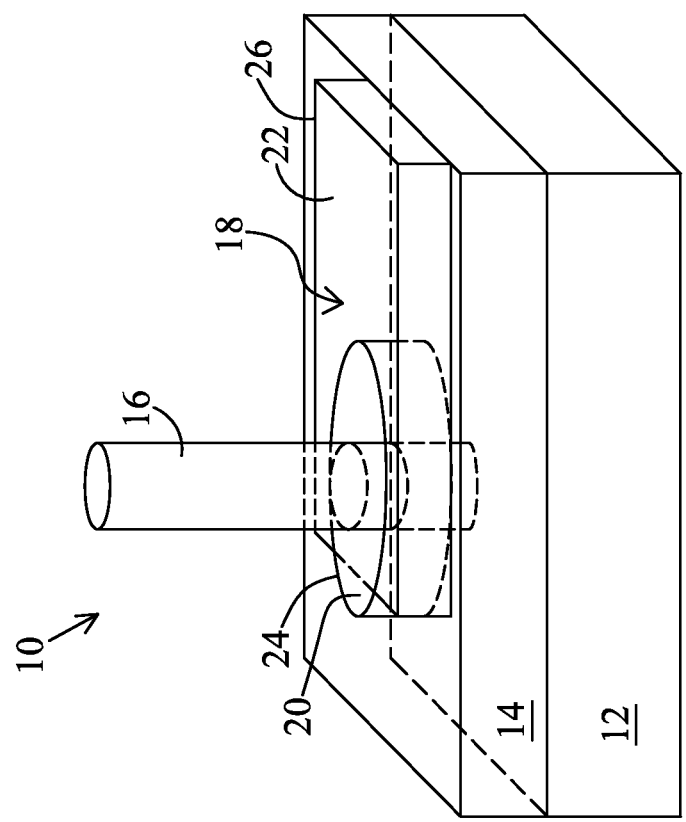
FIG. 1 illustrates an embodiment vertical gate-all-around transistor.

Referring now to FIG. 1, an embodiment vertical gate-all-around (VGAA) transistor 10 is illustrated. As shown, the VGAA transistor 10 includes a substrate 12 supporting an oxide layer 14. In an embodiment, the substrate 12 is formed from silicon, bulk silicon, or a semiconductor material. In an embodiment, the oxide layer 14 is an oxide such as silicon dioxide ($SiO_2$). Other dielectric materials can be used for oxide layer 14, such as oxinitrides or nitrides.

A semiconductor column 16 projects away from the oxide layer 14. In an embodiment, the semiconductor column 16 is a nanowire formed from silicon. In an embodiment, the semiconductor column 26 is made of other semiconductor materials such as silicon germanium (SiGe), silicon carbide (SiC), Silicon carbon germanium (SiCGe), germanium (Ge), III-V compounds, or other semiconductor materials. The semiconductor material can be either monocrystalline, polycrystalline or amorphous. As shown in FIG. 1, the semiconductor column 16 is vertically-oriented relative to the horizontally-oriented oxide layer 14. However, other configurations and orientations are contemplated herein. The cross section of the semiconductor column presented in FIG. 1 is circular, but other section shapes can be used (e.g., square, hexagonal, rectangular, ellipsoidal, triangular, or shapes with sharp or rounded corners).

Still referring to FIG. 1, a gate 18 is formed over the oxide layer 14. In an embodiment, the gate 18 may be something other than a gate and formed from non-metal materials. The gate 18 generally includes a footer portion 20 (a.k.a., spacer-defined portion) and a non-footer portion 22 (a.k.a., gate mask-defined portion). In an embodiment, the footer portion 20 has a ring-like shape with an arcuate periphery 24. In an embodiment, the non-footer portion 22 has a rectangular, square, hexagonal, ellipsoidal, triangular, or other shape with sharp or rounded corners with a corresponding periphery 26. Even so, the gate 18 may be formed in any of a number of suitable configurations.

As will be more fully explained below, the footer portion 20 and the non-footer portion 22 of the gate 18 collectively ensure that the semiconductor column 16 is encircled or surrounded, even if the non-footer portion 22 of the gate 18 is not ideally located relative to the semiconductor column 16 during fabrication of the VGAA transistor 10 due to the inadvertent misalignment of, for example, a gate mask.

Referring collectively to FIGS. 2A-2B through FIGS. 5A-5B, a process flow for fabricating the VGAA transistor 10 of FIG. 1 is illustrated. As shown in perspective and top views of FIGS. 2A-2B, respectively, a spacer 28 is formed around a portion of the semiconductor column 16 projecting from a gate layer 30. As such, the spacer 28 covers and protects the underlying the gate layer 30. In an embodiment, the spacer 28 is a hard mask spacer having an arcuate periphery 32. In other words, the spacer 28 may be formed in the shape of a ring. In an embodiment, the gate layer 30 is a metal gate layer and includes a thin gate dielectric (not shown).

Referring now to FIGS. 3A-3B, a photolithography process is initiated to form a photoresist 34. As shown, the photoresist 34 is formed over a protected portion 36 of the gate layer 30 and a portion of the spacer 28. In other words, the photoresist 32 covers and protects portions of the underlying the gate layer 30 not already protected by the spacer 28.

Referring now to FIGS. 3A-3B and 4A-4B, an unprotected portion 38 of the gate layer 30, which is disposed outside a periphery 40 collectively defined by the spacer 28 and the photoresist 32, is etched away. In an embodiment, the unprotected portion 38 is etched away using a dry etching process or another suitable etching process. By etching away the unprotected portion 38 of the gate layer 30, the gate 18 having the footer portion 20 and a non-footer portion 22 is formed as shown in FIGS. 4A-4B.

The footer portion 20 generally corresponds in size and shape to the spacer 28 and the non-footer portion 22 generally corresponds in size and shape to the photoresist 34. As will be more fully explained below, the footer portion 20 and the non-footer portion 22 of the gate 18 collectively encircle the semiconductor column 16, even if a mask used to form the gate 18 is inadvertently misaligned.

Figure 5B:
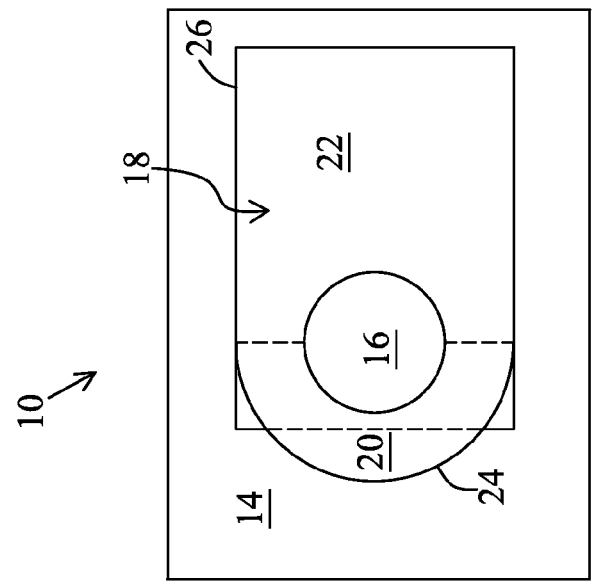
Figure 5A:
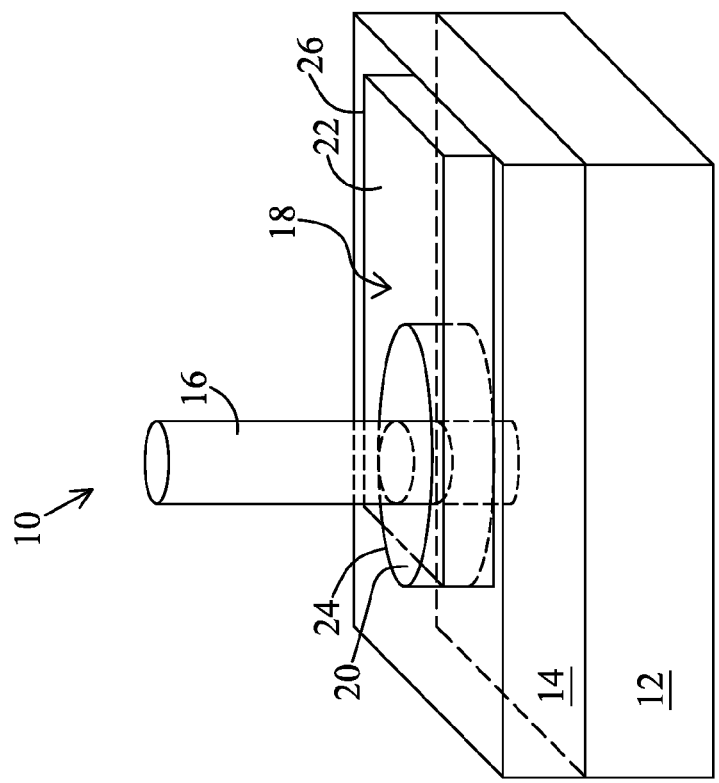

Still referring to FIGS. 3A-3B and 4A-4B, after the unprotected portion 38 of the gate layer 30 has been removed and the gate 18 defined, the photoresist 34 is removed. Thereafter, as shown in FIGS. 5A-5B, the spacer 28 is removed to form the embodiment VGAA transistor 10 of FIG. 1.

Figure 6:
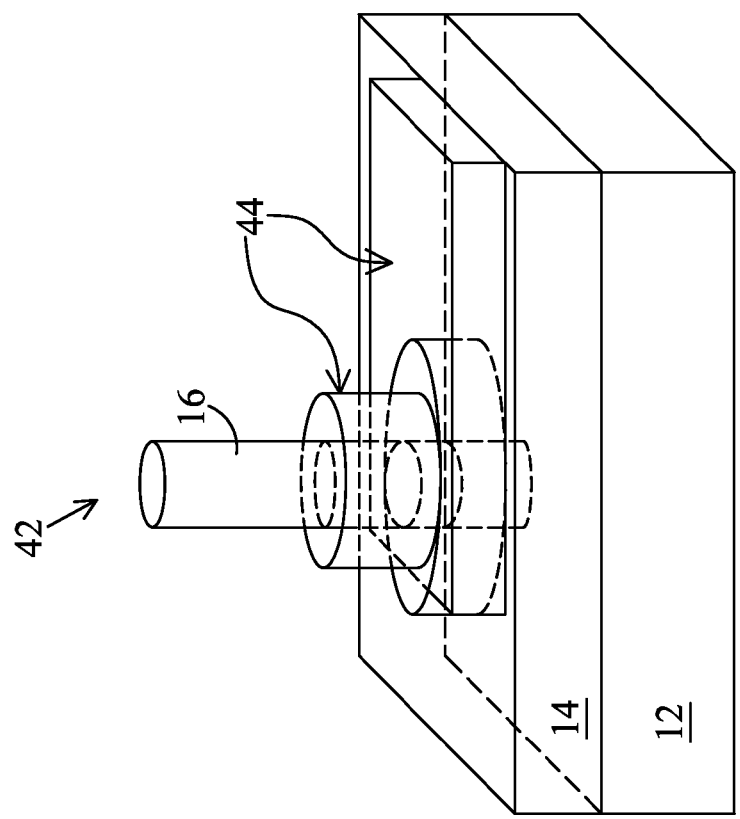
FIG. 6 illustrates an embodiment vertical gate-all-around transistor.

Referring now to FIG. 6, an embodiment vertical gate-all-around (VGAA) transistor 42 is illustrated. The embodiment VGAA transistor 42 of FIG. 6 is similar to the VGAA transistor 10 of FIG. 1. Indeed, the VGAA transistor 42 includes the substrate 12, the oxide layer 14, and the semiconductor column 16. However, a gate 44 of the embodiment VGAA transistor 42 of FIG. 6 is formed somewhat differently and has a different configuration than the gate 18 of the embodiment VGAA of FIG. 1.

Figure 7B:
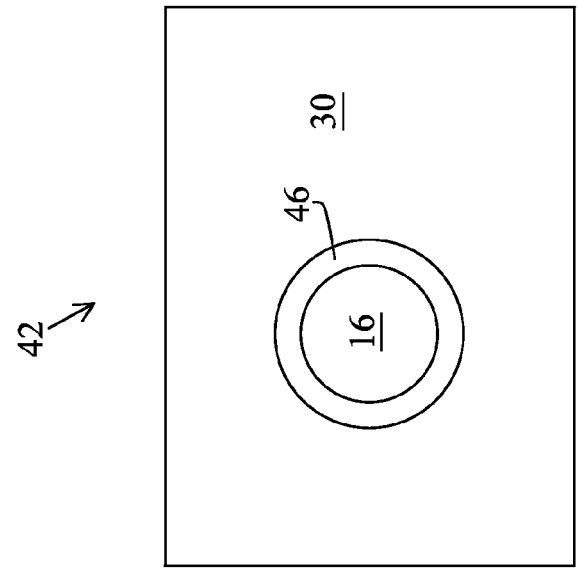
FIGS. 7A-7B to FIGS. 12A-12B illustrate a perspective view and a top view of a process of forming the embodiment vertical gate-all-around transistor of FIG. 1.
Figure 7A:
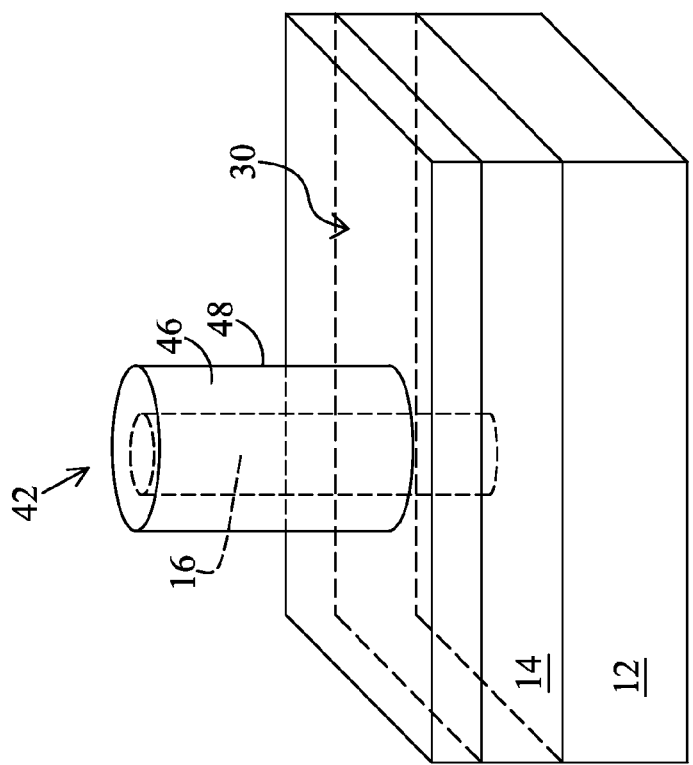

Referring collectively to FIGS. 7A-7B through FIGS. 12A-12B, a process flow for fabricating the VGAA transistor 42 of FIG. 6 is illustrated. As shown in FIGS. 7A-7B, the gate layer 30 and the gate layer 46 are simultaneously formed over the oxide layer 14 and an initially exposed portion of the semiconductor column 16. In FIG. 7A, the gate layer 30 and the gate layer 46 are a deposited layer that covers both the insulator layer 40 and the semiconductor column 16. The portion of the deposited layer that covers the insulator 14 is referred to as the gate layer 30 and the portion of the deposited layer that covers the semiconductor column 16 is referred to as the gate layer 46. The gate layer 30 and the gate layer 46 are formed from a suitable gate material and collectively form the gate or the gate stack of the device.

In an embodiment, the gate layer 46 is a metal gate spacer having an arcuate periphery 48. In other words, the gate layer 46 may be formed in the shape of a ring. In an embodiment, the gate layer 30 is a metal gate layer. Because the gate layer 30 and the gate layer 46 are formed at the same time, they generally have a uniform thickness.

Figure 8B:
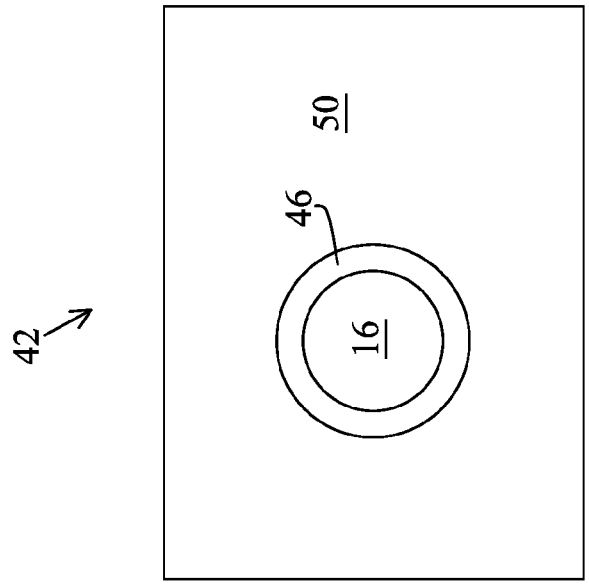
Figure 8A:
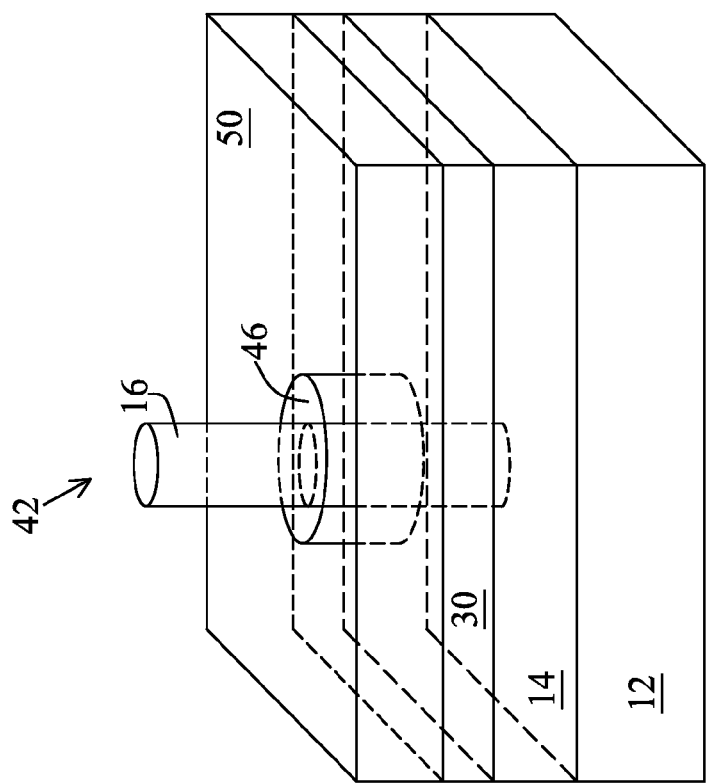

Referring now to FIGS. 8A-8B, an additional oxide layer 50 is deposited over the gate layer 30 and around the gate layer 46. Thereafter, chemical mechanical processing (CMP) is used to flatten the surface of the additional oxide layer 50 and an etchback process is used to recess both the additional oxide layer 50 and the gate layer 46 to give the gate layer 46 a desired height (which is equal to the thickness of the additional oxide layer 50 as recessed).

As shown in FIGS. 9A-9B, a spacer 52 is formed around a subsequently exposed portion of the semiconductor column 16. The spacer 52 covers and protects portions of the underlying the gate layer 30 and the gate layer 46. In an embodiment, the spacer 52 is a hard mask spacer having an arcuate periphery 54. In other words, the spacer 52 may be formed in the shape of a ring.

Referring now to FIGS. 10A-10B, a photolithography process is initiated to form the photoresist 34. As shown, the photoresist 34 is formed over the protected portion 36 of the gate layer 30 and a portion of the spacer 52. Therefore, the photoresist 34 covers and protects the underlying the gate layer 30 not already protected by the spacer 52.

Referring now to FIGS. 10A-10B and 11A-11B, an unprotected portion 38 of the gate layer 30, which is disposed outside the periphery 40 collectively defined by the spacer 52 and the photoresist 34, is etched away. In an embodiment, the unprotected portion 38 is etched away using a dry etching process or another suitable etching process. By etching away the unprotected portion 38 of the gate layer 30, the footer portion 20 and the non-footer portion 22 are formed as shown in FIGS. 11A-11B.

Figure 12B:
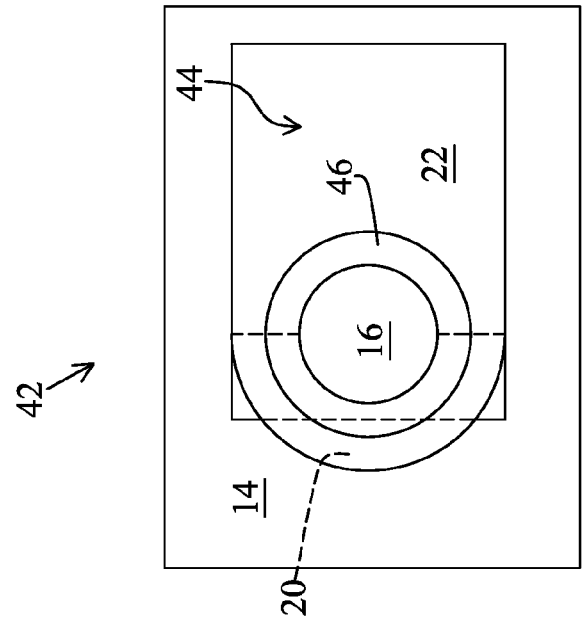
Figure 12A:
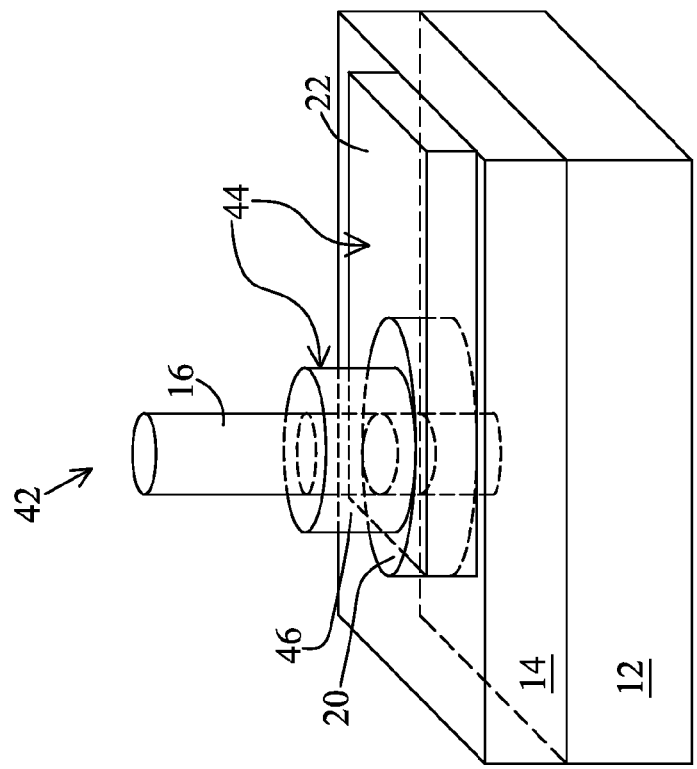

We now refer to FIGS. 12A-12B. The footer portion 20 generally corresponds in size and shape to the spacer 52 and the non-footer portion 22 generally corresponds in size and shape to the photoresist 34. As will be more fully explained below, the footer portion 20 and the non-footer portion 22 collectively encircle the semiconductor column 16, even if a mask used to form the entire gate 44 is inadvertently misaligned.

Still referring to FIGS. 12A-12B, after the unprotected portion 38 of the gate layer 30 has been removed, the photoresist 34 and the spacer 52 are removed. With the photoresist 34 and the spacer 52 removed, the embodiment VGAA transistor 42 of FIG. 6 is formed. As shown, the gate 44 of the embodiment VGAA transistor 42 is collectively formed by the footer portion 20, the non-footer portion 22, and the lower portion of the gate layer 46. In an embodiment, the lower portion of the gate layer 46 shown in FIG. 12A may be used to control a gate length where the collective gate 44 is a metal gate.

Figure 13:
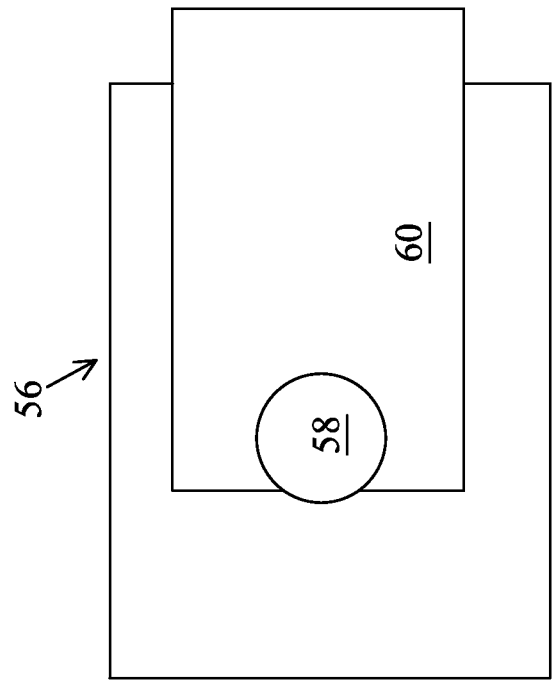
FIGS. 13-14 illustrate a conventional vertical gate-all-around transistor that is defective due to gate misalignment.
Figure 14:
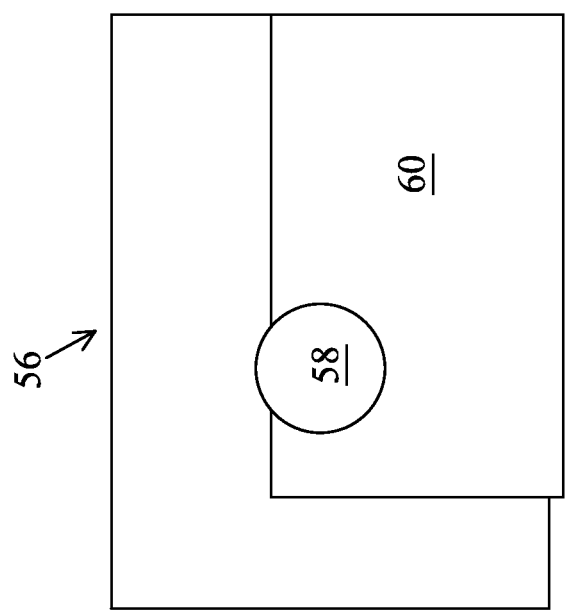
Figure 16:
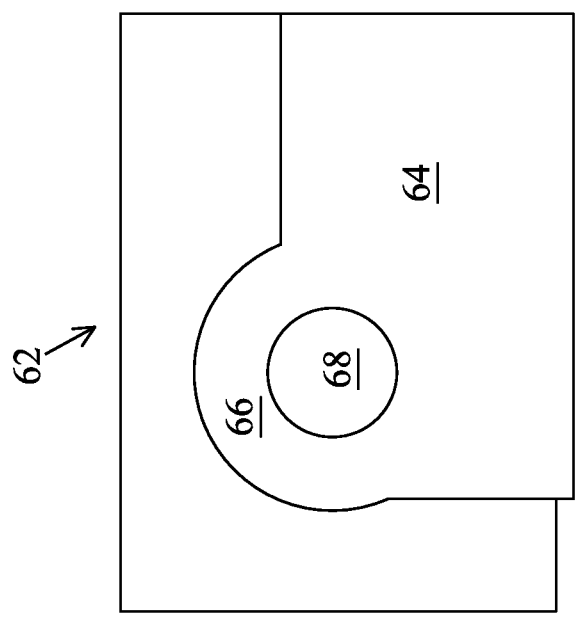
FIGS. 15-16 illustrate an embodiment vertical gate-all-around transistor that compensates for misalignment by using a footer.
Figure 15:
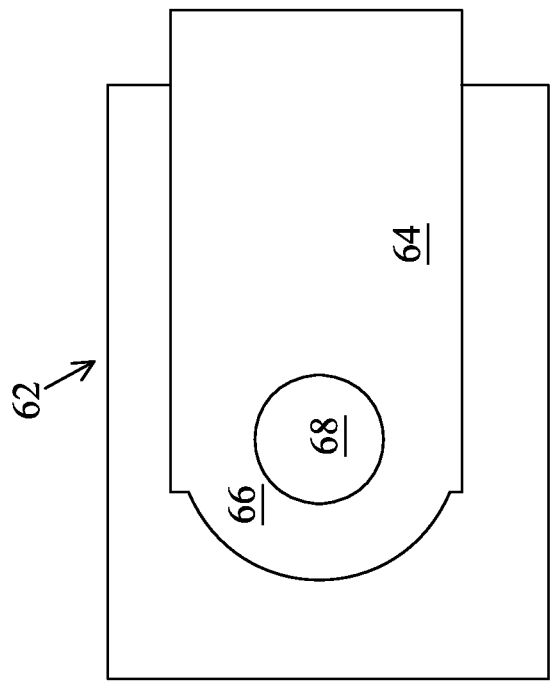

FIGS. 13-14 illustrate a conventional vertical gate-all-around transistor 56 that is defective due to misalignment. Indeed, the gate 58 does not completely surround the vertical nanowire 60. In contrast, FIGS. 15-16 illustrate an embodiment vertical gate-all-around transistor 62 that compensates for misalignment using a gate 64 with a footer 66. Indeed, because of the footer 66 the gate 64 (i.e., gate electrode) completely surrounds or encircles a nanowire 68. Therefore, in case of poor alignment (i.e., if the rectangular gate mask does not completely surround the vertical nanowire 68) the vertical semiconductor nanowire 68 is still fully surrounded by gate material.

Figure 21:
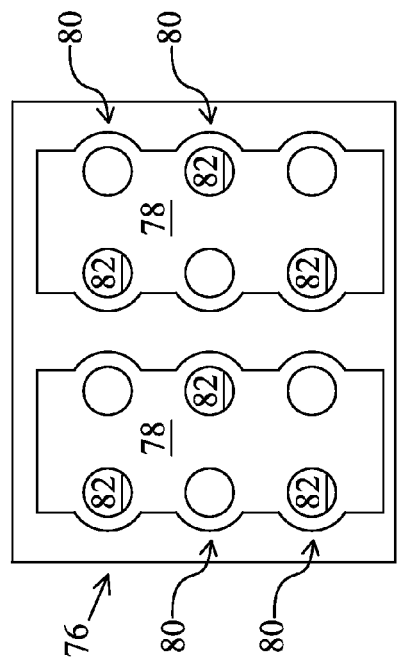
FIGS. 20-21 illustrate an embodiment vertical gate-all-around transistor that compensates for misalignment using a footer.
Figure 20:
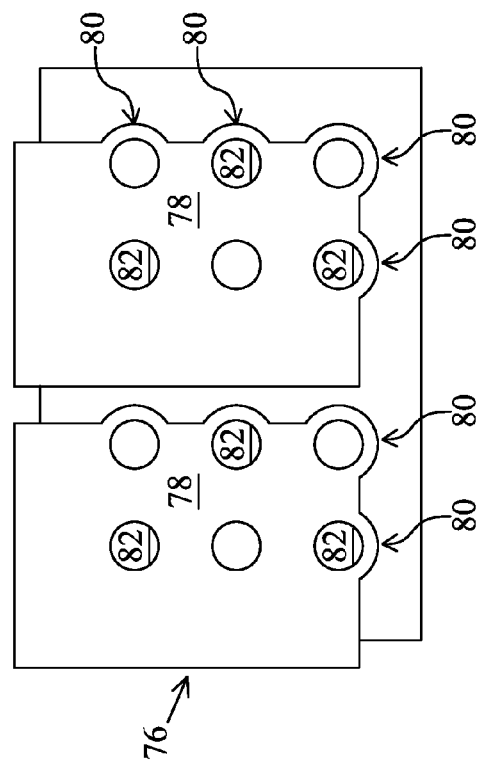

FIG. 17 illustrates a tolerance, L, needed for the gate mask of a conventional vertical gate-all-around transistor 70 with several nanowires 72 surrounded by a gate 74. FIGS. 18-19 illustrate the conventional vertical gate-all-around transistor 70, which is in a defective condition due to misalignment of the nanowires 72 relative to the gate 74. Indeed, the gate 74 does not completely surround each of the vertical nanowires 72. In contrast, FIGS. 20-21 illustrate an embodiment vertical gate-all-around transistor 76 that compensates for gate mask misalignment using a gate 78 with a footer 80. Indeed, the gate 78 (i.e., gate electrode) completely surrounds or encircles each of the nanowires 82 due, in part, to the footer 80. Therefore, a reduction of the gate mask width is now acceptable.

Figure 22:
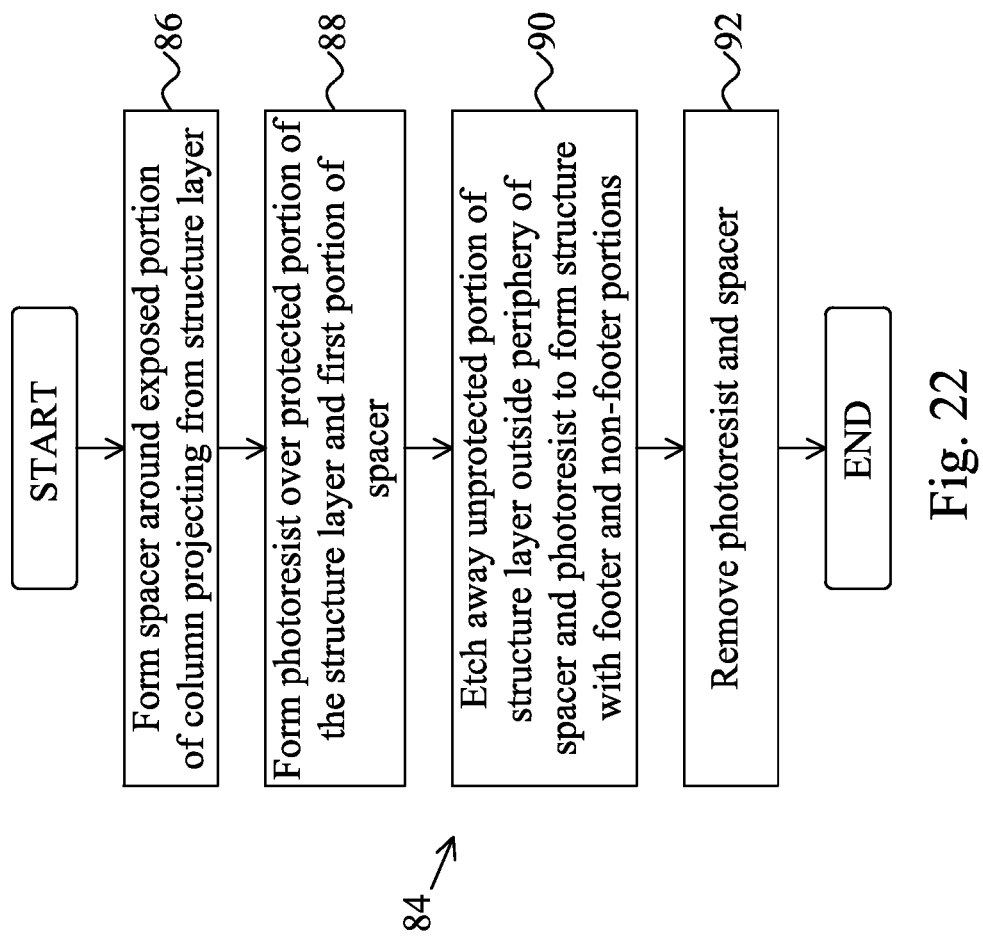
FIG. 22 is an embodiment method of making a self-aligned vertical gate-all-around device.

Referring now to FIG. 22, an embodiment method 84 of making a self-aligned vertical gate-all-around device is illustrated. In block 86, a spacer is formed around an exposed portion of a semiconductor column projecting from a gate layer. In block 88, a photoresist is formed over a protected portion of the gate layer and a first portion of the spacer. In block 90, an unprotected portion of the gate layer disposed outside a periphery collectively defined by the spacer and the photoresist is etched away to form a gate having a footer portion and a non-footer portion. The non-footer portion and the footer portion collectively encircle the semiconductor column. In block 92, the photoresist and the spacer are removed.

Figure 23:
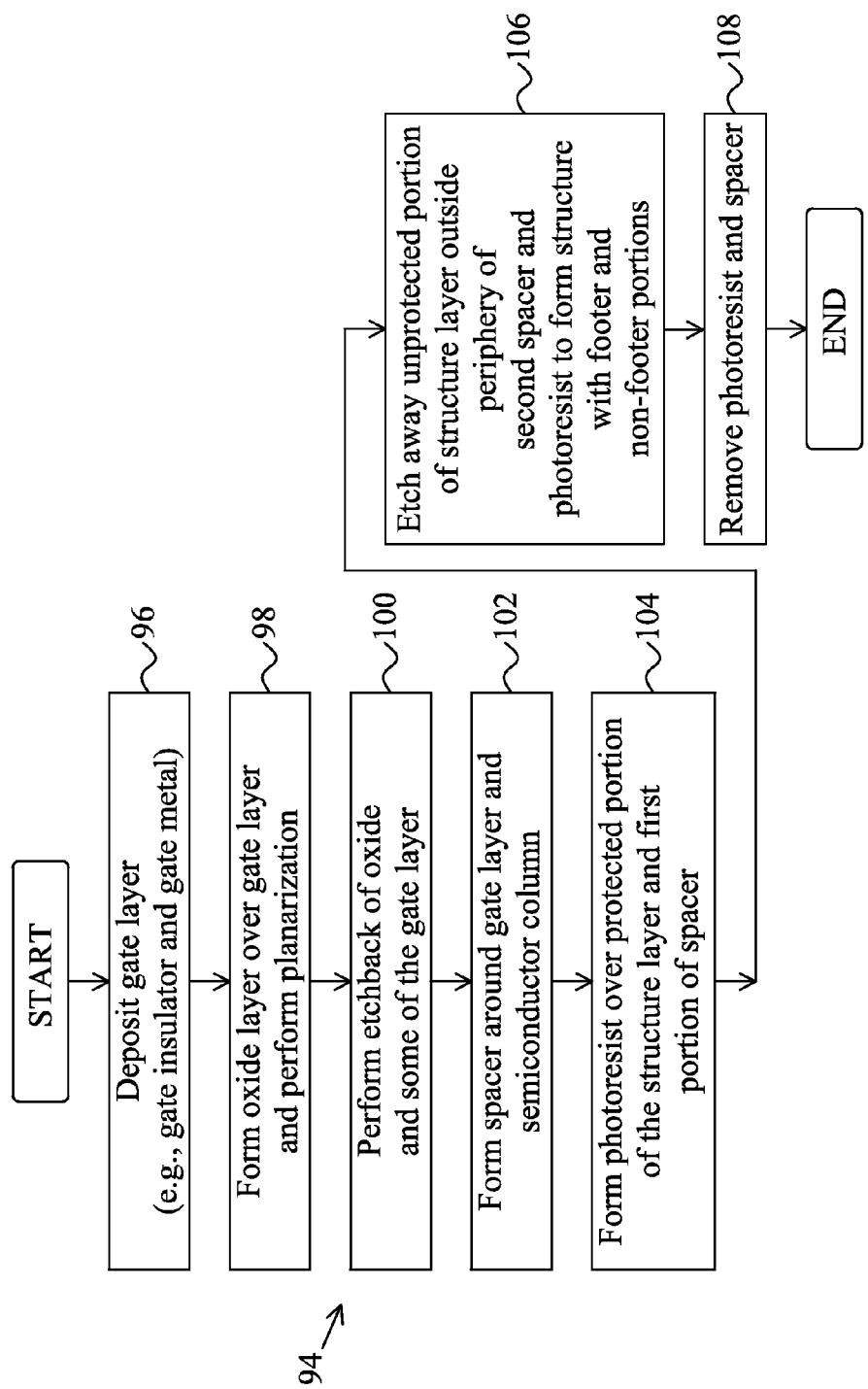
FIG. 23 is an embodiment method of making a self-aligned vertical gate-all-around device.

Referring now to FIG. 23, an embodiment method 94 of making a self-aligned vertical structure-all-around device is illustrated. In block 96, a gate layer is deposited around an initial exposed portion of a semiconductor column and over an initial oxide layer. In block 98, an additional oxide layer is formed over the gate layer and then planarized. In block 100, an etchback process is performed to recess the additional oxide layer and a portion of the gate layer wrapped around the initially exposed portion of the semiconductor column. In block 102, a spacer is formed around the gate layer remaining around the initially exposed portion of the semiconductor column and a subsequently exposed portion of the semiconductor column.

In block 104, a photoresist is formed over a protected portion of the gate layer and a first portion of the spacer. In block 106, an unprotected portion of the gate layer disposed outside a periphery collectively defined by the spacer 28 and the photoresist is etched away to form a gate having a footer portion and a non-footer portion. The non-footer portion and the footer portion collectively encircle the semiconductor column and the portion of the gate 46 that is wrapped around the column. In block 108, the photoresist 34 and the spacer 28 are removed.

From the foregoing, it should be recognized that a self-aligned vertical wrapped-around gate may be fabricated using the concepts disclosed herein. Because the gate (e.g., the printed gate) has and employs a footer (e.g., a gate footer), the gate is self-aligning and ensures that, for example, a vertical nanowire is entirely surrounded. By way of example, a gate that is formed using the concepts disclosed herein is the result of a "logical OR" function or additive combination of the gate mask and the footprint of the spacer. This allows for automatic self-alignment of the gate and improved tolerance to misalignment of the printed gate level. As such, the design rules with regard to gate alignment can be relaxed, which increases or improves packing density.

In addition, the tolerance alignment of the gate to the active area (nanowire) is improved. The dimensions (width and pitch) of the gate level can be tightened. Both improved alignment tolerances and dimensions tightening improve integration density.

An embodiment method of making a self-aligned vertical gate-all-around device includes forming a spacer around an exposed portion of a semiconductor column projecting from a gate layer, forming a photoresist over a protected portion of the gate layer and a first portion of the spacer, etching away an unprotected portion of the gate layer disposed outside a periphery collectively defined by the spacer and the photoresist to form a gate having a footer portion and a non-footer portion, the non-footer portion and the footer portion collectively encircling the semiconductor column, and removing the photoresist and the spacer.

An embodiment method of making a self-aligned vertical gate-all-around device includes depositing a gate layer around an initial exposed portion of a semiconductor column and over an initial oxide layer, forming an additional oxide layer over the gate layer and planarizing the additional oxide layer, performing an etchback process to recess the additional oxide layer and a portion of the gate layer wrapped around the initially exposed portion of the semiconductor column, forming a spacer around the gate layer remaining around the initially exposed portion of the semiconductor column and a subsequently exposed portion of the semiconductor column, forming a photoresist over a protected portion of the gate layer and a first portion of the spacer, etching away an unprotected portion of the gate layer disposed outside a periphery collectively defined by the spacer and the photoresist to form a gate having a footer portion and a non-footer portion, the footer portion and the non-footer portion collectively encircling the semiconductor column, and removing the photoresist and the second spacer.

An embodiment vertical gate-all-around transistor includes an oxide layer disposed over a semiconductor layer, a semiconductor column projecting from the oxide layer, and a gate disposed over the oxide layer, the gate having a footer portion and a non-footer portion collectively encircling the semiconductor column.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of making a self-aligned vertical gate-all-around device, comprising:
    forming a spacer around an exposed portion of a semiconductor column projecting from a gate layer;
    forming a photoresist over a protected portion of the gate layer and a first portion of the spacer;
    etching away an unprotected portion of the gate layer disposed outside a periphery collectively defined by the spacer and the photoresist to form a gate having a footer portion and a non-footer portion, the non-footer portion and the footer portion collectively encircling the semiconductor column; and
    removing the photoresist and the spacer.

2. The method of claim 1, wherein the spacer is a hard mask spacer.

3. The method of claim 1, wherein the semiconductor column is a vertical column and the gate layer is a horizontal gate layer.

4. The method of claim 1, wherein the gate layer is a metal gate layer.

5. The method of claim 1, wherein the spacer has a spacer periphery that is at least partially arcuate.

6. The method of claim 1, wherein the spacer is formed in a shape of a ring.

7. The method of claim 1, further comprising forming the gate layer over an oxide layer and a semiconductor layer.

8. A method of making a self-aligned vertical gate-all-around device, comprising:

depositing a gate layer around an initial exposed portion of a semiconductor column and over an initial oxide layer;

forming an additional oxide layer over the gate layer and planarizing the additional oxide layer;

performing an etchback process to recess the additional oxide layer and a portion of the gate layer wrapped around the initially exposed portion of the semiconductor column;

forming a spacer around the gate layer remaining around the initially exposed portion of the semiconductor column and a subsequently exposed portion of the semiconductor column;

forming a photoresist over a protected portion of the gate layer and a first portion of the spacer;

etching away an unprotected portion of the gate layer disposed outside a periphery collectively defined by the spacer and the photoresist to form a gate having a footer portion and a non-footer portion, the footer portion and the non-footer portion collectively encircling the semiconductor column; and removing the photoresist and the spacer.

9. The method of claim 8, further comprising planarazing the additional oxide layer using a chemical-mechanical polishing process.

10. The method of claim 8, further comprising defining a gate length by removing an upper portion of the gate layer using a chemical-mechanical polishing process and the etchback process.

11. The method of claim 8, wherein the semiconductor column is a vertical column and the gate layer is a horizontal gate layer.

12. The method of claim 8, wherein the gate layer is a metal gate layer.

13. The method of claim 8, wherein the spacer has a spacer periphery that is at least partially arcuate.

14. The method of claim 8, further comprising forming the gate layer over a silicon dioxide layer supported by a silicon substrate.

15. A method of making a self-aligned vertical gate-all-around device, comprising:

forming a gate layer over a substrate, the gate layer having a semiconductor feature protruding the gate layer;

forming a spacer around the semiconductor feature, the spacer covering a portion of the gate layer;

forming a patterned mask, the patterned mask covering a portion of the spacer and a portion of the gate layer;

patterning the gate layer to remove portions of the gate layer unprotected by one or more of the spacer and the patterned mask; and removing the patterned mask.

16. The method of claim 15, further comprising:

forming a gate spacer over the gate layer, the gate spacer encircling a portion of the semiconductor feature, wherein the gate spacer is conductive;

wherein the forming the patterned mask comprises forming the spacer over the gate spacer.

17. The method of claim 16, wherein the forming the gate spacer comprises:

forming a gate spacer layer along sidewalls of the semiconductor feature;

forming a masking layer along sidewalls of the gate spacer layer; and recessing the gate spacer layer, thereby forming the gate spacer.

18. The method of claim 17, wherein the forming the masking layer comprises:

forming the masking layer over an upper surface of the gate spacer layer;

planarizing the masking layer; and recessing the masking layer.

19. The method of claim 15, wherein the spacer forms a ring encircling the semiconductor feature in a plan view.

20. The method of claim 15, wherein a portion of the spacer protrudes from the patterned mask.

* * * * *